US011756615B2

(12) United States Patent
Carissimi et al.

(10) Patent No.: US 11,756,615 B2
(45) Date of Patent: Sep. 12, 2023

(54) MEMORY DEVICE AND METHOD FOR IN-MEMORY COMPUTING

(71) Applicant: STMicroelectronics S.r.l., Agrate Brianza (IT)

(72) Inventors: Marcella Carissimi, Treviolo (IT); Marco Pasotti, Travaco' Siccomario (IT); Roberto Antonio Canegallo, Rimini (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 136 days.

(21) Appl. No.: 17/462,250

(22) Filed: Aug. 31, 2021

(65) Prior Publication Data

US 2022/0068380 A1 Mar. 3, 2022

(30) Foreign Application Priority Data

Aug. 31, 2020 (IT) .......................... 102020000020761

(51) Int. Cl.
*G11C 11/00* (2006.01)
*G11C 13/00* (2006.01)
*G06N 3/02* (2006.01)

(52) U.S. Cl.
CPC ........ G11C 13/0026 (2013.01); G11C 13/003 (2013.01); G11C 13/004 (2013.01);
(Continued)

(58) Field of Classification Search
CPC ............ G11C 13/0026; G11C 13/0004; G11C 13/003; G11C 13/0038
(Continued)

(56) References Cited

U.S. PATENT DOCUMENTS 10,089,574 B2  10/2018  Buchanan et al.
2004/0245975 A1* 12/2004  Tran .......................... G05F 3/30
                                                      323/313

(Continued)

FOREIGN PATENT DOCUMENTS

DE  102020113902 A1  12/2020
WO     2017105514 A1   6/2017

OTHER PUBLICATIONS

Fujiki, Daichi et al., "In-Memory Data Parallel Processor", ASPLOS'18, Seasion 1A: New Architectures, Mar. 24-28, 2018, Va, USA, 16 pages.

*Primary Examiner* — Vu A Le
(74) *Attorney, Agent, or Firm* — Slater Matsil, LLP

(57) ABSTRACT

An embodiment memory device comprises a plurality of memory cells, each exhibiting a transconductance depending on a value of a stored bit, a plurality of bit lines associated with respective groups of memory cells, each bit line configured to flow a respective electric current indicative of the bit stored in a selected memory cell of the respective group of memory cells, and a computing circuit providing an output electric quantity indicative of a linear combination of a plurality of input electric quantities. The computing circuit comprises a biasing stage configured to bias each bit line with a respective input electric quantity, the electric current flowing through each bit line based on a product of the respective input electric quantity and the transconductance of the selected memory cell, and a combining stage for combining the electric currents flowing through the plurality of bit lines thereby obtaining the output electric quantity.

20 Claims, 7 Drawing Sheets

(52) U.S. Cl.
CPC ...... *G11C 13/0004* (2013.01); *G11C 13/0038* (2013.01); *G06N 3/02* (2013.01)

(58) Field of Classification Search
USPC .......................................... 365/163
See application file for complete search history.

(56) References Cited

U.S. PATENT DOCUMENTS

| | | |
|---|---|---|
| 2017/0220526 A1 | 8/2017 | Buchanan |
| 2020/0301667 A1 | 9/2020 | Hung et al. |
| 2021/0271959 A1* | 9/2021 | Chettuvetty ........... G06G 7/163 |
| 2022/0004852 A1* | 1/2022 | Ju ...................... G11C 11/4074 |

* cited by examiner

MEMORY DEVICE AND METHOD FOR IN-MEMORY COMPUTING

CROSS-REFERENCE TO RELATED APPLICATIONS

This application claims the benefit of Italian Patent Application No. 102020000020761, filed on Aug. 31, 2020, which application is hereby incorporated herein by reference.

TECHNICAL FIELD

The present disclosure generally relates to the field of memory devices and methods. Particularly, the present disclosure relates to non-volatile random-access memory devices and methods. More particularly, the present disclosure relates to memory devices featuring in-memory computing, and associated methods.

BACKGROUND

Non-volatile memory devices are increasingly widespread.

Considering, just as an example, a memory device based on PCM ("Phase Change Memory") memory cells, each memory cell is configured to store data using phase change materials (such as chalcogenide) capable of stably transitioning between amorphous and crystalline phases according to an amount of heat transferred thereto (wherein the amount of heat is determined by a programming electric current applied to the memory cell). The amorphous and crystalline phases exhibit different resistance values, (or, equivalently, transconductance values) which are used to distinguish different logic states of the memory cell: particularly, the amorphous phase exhibits a relatively high resistance (or, equivalently, a relatively low transconductance value), and the crystalline phase exhibits a relatively low resistance (or, equivalently, a relatively high transconductance value).

Typically, the amorphous phase is used to represent a logic state "o" (usually referred to as RESET state), and the crystalline phase is used to represent a logic state "1" (usually referred to as SET state).

The memory cells are typically arranged in a matrix of rows, corresponding to a plurality of word lines, and columns, corresponding to a plurality of bit lines, the memory cells being for example arranged in the matrix at intersections between the world lines and the bit lines.

A conventional memory device typically comprises a reading circuit selectively coupleable to the bit lines for reading the logic state of selected memory cells.

An emerging technology for non-volatile memory devices comprises in-memory computing.

In-memory computing (IMC) is the storage and the computation of information in a random-access memory device (e.g. a random-access memory device of dedicated servers or of edge devices like smartphones, smart sensors, and the like) rather than the standard computation scheme which involves moving data back and forth between a memory device and computing unit until a full computation flow is achieved. This removes limitations associated to data transfer bandwidth and helps reducing power consumption.

In-memory computing helps business customers, including retailers, banks and utilities, to quickly detect patterns, analyze massive data volumes on the fly, and perform their operations quickly.

SUMMARY

Applicant has understood that the conventional solutions of in-memory computing are not satisfactory.

Applicant has understood that the conventional solutions of in-memory computing are not adapted to be used in applications involving big data processing, such as neural network applications requiring matrix processing.

Indeed, in the conventional solutions of in-memory computing data processing is serially performed by controllers (for example, one or more microprocessors and/or one or more microcontrollers). Performing serial processing of matrices, especially of large matrices (such as the matrices of neural network applications), determines a significant increase in energy consumption and processing times.

Moreover, the conventional solutions of in-memory computing require the use of additional non-volatile memory to store processing parameters (e.g., neural network parameters), which results in cost and size increases.

Applicant has also understood that the conventional solutions of in-memory computing cannot be adapted to different memory cuts. The need of designing dedicated IMC memory cut determines time and cost increases.

Applicant has faced the above-mentioned issues, and has devised a memory device comprising a computing circuit that allows performing parallel big data processing by exploiting the memory cells (and the logic states stored therein) and bit lines already available in the memory device. As the computing circuit has a low circuit complexity and mainly requires simple electrical connections to the bit lines already available at a top of any existing memory device, the computing circuit can be easily designed and added to any existing memory cut, so as to turn any existing memory cut into an IMC capable memory cut.

One or more aspects of the present disclosure are set out in the independent claims, with advantageous features of the same disclosure that are indicated in the dependent claims, whose wording is enclosed herein verbatim by reference (with any advantageous feature being provided with reference to a specific aspect of the present disclosure that applies mutatis mutandis to any other aspect).

More specifically, an aspect of the present disclosure relates to a memory device. The memory device may comprise a plurality of memory cells each one adapted to store at least one bit. Each memory cell exhibits a transconductance depending on a value of the at least one bit stored in the memory cell. The memory device may comprise a plurality of bit lines associated with respective groups of memory cells of the plurality of memory cells. Each bit line is configured to be flown through by a respective electric current indicative of the at least one bit stored in a selected memory cell of the respective group of memory cells. The memory device may comprise a computing circuit electrically couplable to the plurality of bit lines for providing an output electric quantity indicative of a linear combination of a plurality of input electric quantities. The computing circuit may comprise a biasing stage configured to bias each bit line with a respective one of the plurality of input electric quantities, whereby the electric current flowing through each bit line depends on a product between the respective input electric quantity and the transconductance of the selected memory cell of the respective group of memory cells. The input electric quantity and the transconductance associated with each electric current represent a respective term and a corresponding coefficient, respectively, of the linear combination. The computing circuit may comprise a combining stage for combining the electric currents flowing through the plurality of bit lines thereby obtaining the output electric quantity.

According to an embodiment, whose features are additional or alternative to any features of the previous embodiments, the memory device further comprises a reading circuit electrically couplable to the plurality of bit lines for reading the at least one bit stored in the selected memory cell, and a coupling circuit for coupling the reading circuit to the plurality of bit lines. The coupling circuit may be configured to electrically decouple the reading circuit from the plurality of bit lines when the computing circuit is electrically coupled to the plurality of bit lines.

According to an embodiment, whose features are additional or alternative to any features of the previous embodiments, the combining stage comprises an integrator circuit, for example an operational amplifier—based integrator circuit.

According to an embodiment, whose features are additional or alternative to any features of the previous embodiments, the combining stage comprises a current mirror circuit. The current mirror circuit may comprise a first circuit branch electrically couplable to the plurality of bit lines for receiving the electric currents therefrom, a second circuit branch in mirror configuration with the first circuit branch, the electric currents from the plurality of bit lines being mirrored from the first circuit branch to the second circuit branch, and an impedance load for receiving the mirrored electric currents and providing the output electric quantity therefrom.

According to an embodiment, whose features are additional or alternative to any features of the previous embodiments, the combining stage comprises a current mirror circuit. The current mirror circuit may comprise a first circuit branch electrically couplable to a first subset of the plurality of bit lines for receiving the respective electric currents therefrom, a second circuit branch in mirror configuration with the first circuit branch and electrically couplable to a second subset of the plurality of bit lines for receiving the respective electric currents therefrom, the electric currents from the first subset of the plurality of bit lines being mirrored from the first circuit branch to the second circuit branch, and an impedance load for receiving the mirrored electric currents from the first subset of the plurality of bit lines and the electric currents from the second subset of the plurality of bit lines, and for providing the output electric quantity therefrom.

According to an embodiment, whose features are additional or alternative to any features of the previous embodiments, the plurality of input electric quantities comprises a plurality of input electric voltages. The biasing stage may comprise a plurality of biasing circuits each one associated with a respective group of memory cells for biasing it with a respective one of the plurality of input electric voltages. Each biasing circuit may comprise a voltage controlled current source being adapted to be controlled by a respective one of the plurality of input electric voltages.

According to an embodiment, whose features are additional or alternative to any features of the previous embodiments, the biasing stage comprises a plurality of selection circuits, each one associated with a respective group of memory cells, and each one configured to provide a selected one of the plurality of input electric quantities to bias the bit lines associated with the respective group of memory cells.

According to an embodiment, whose features are additional or alternative to any features of the previous embodiments, the memory device comprises a phase-change memory device.

Another aspect of the present disclosure relates to an electronic system comprising such a memory device, or more thereof.

A further aspect of the present disclosure relates to a method for operating a memory device. The memory device may comprise a plurality of memory cells each one adapted to store at least one bit. Each memory cell exhibits a transconductance depending on a value of the at least one bit stored in the memory cell. The memory device may comprise a plurality of bit lines associated with respective groups of memory cells of the plurality of memory cells. Each bit line may be configured to be flown through by a respective electric current indicative of the at least one bit stored in a selected memory cell of the respective group of memory cells. The method may comprise biasing each bit line with a respective one of a plurality of input electric quantities, whereby the electric current flowing through each bit line depends on a product between the respective input electric quantity and the transconductance of the selected memory cell of the respective group of memory cells. The method may comprise combining the electric currents flowing through the plurality of bit lines thereby obtaining an output electric quantity indicative of a linear combination of the plurality of input electric quantities. The input electric quantity and the transconductance associated with each electric current represent a respective term and a corresponding coefficient respectively, of the linear combination.

BRIEF DESCRIPTION OF THE DRAWINGS

These and other features and advantages of the present disclosure will be made apparent by the following description of some exemplary and non-limitative embodiments thereof; for its better intelligibility, the following description should be read making reference to the attached drawings, wherein.

DETAILED DESCRIPTION OF ILLUSTRATIVE EMBODIMENTS

Figure 1A:
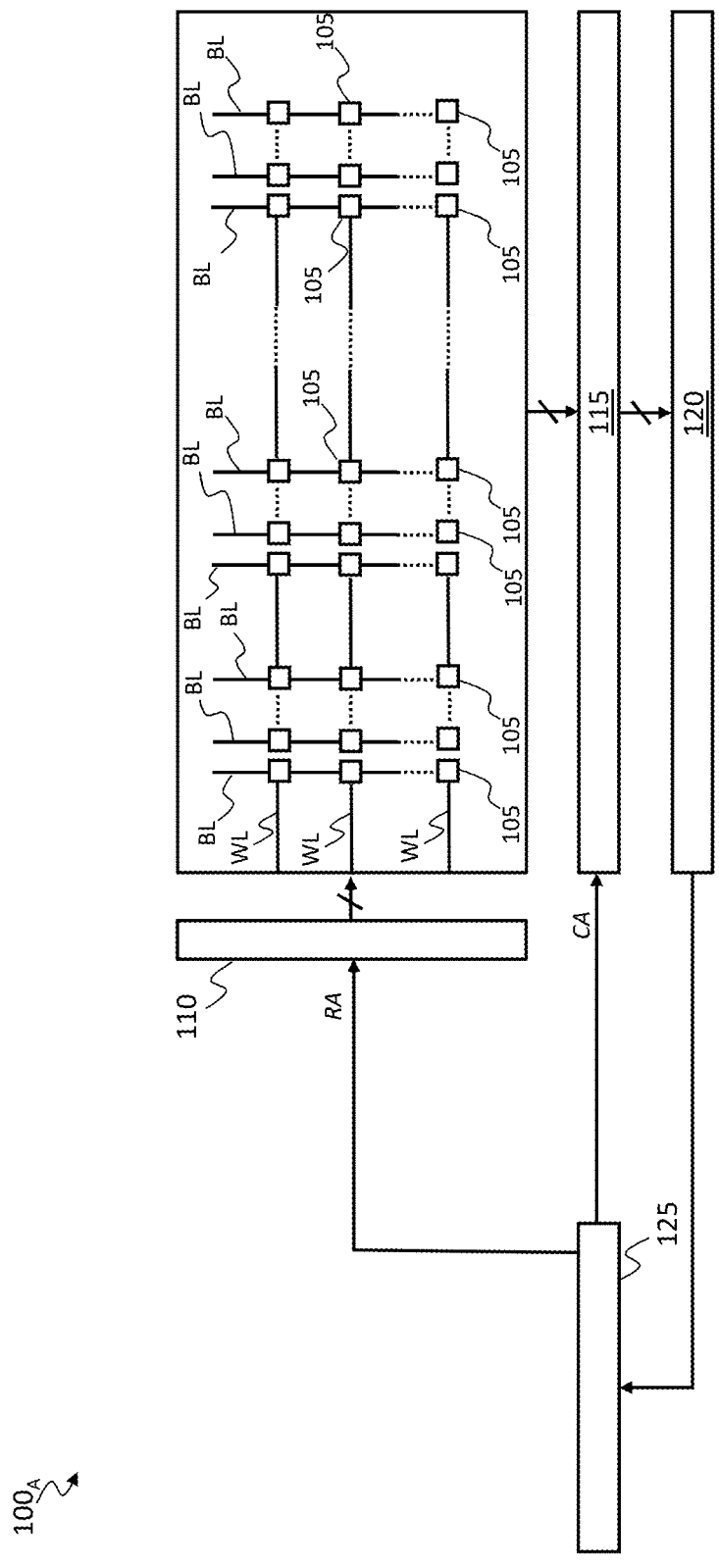
FIG. 1A shows a schematic circuit diagram of a known memory device.
Figure 1B:
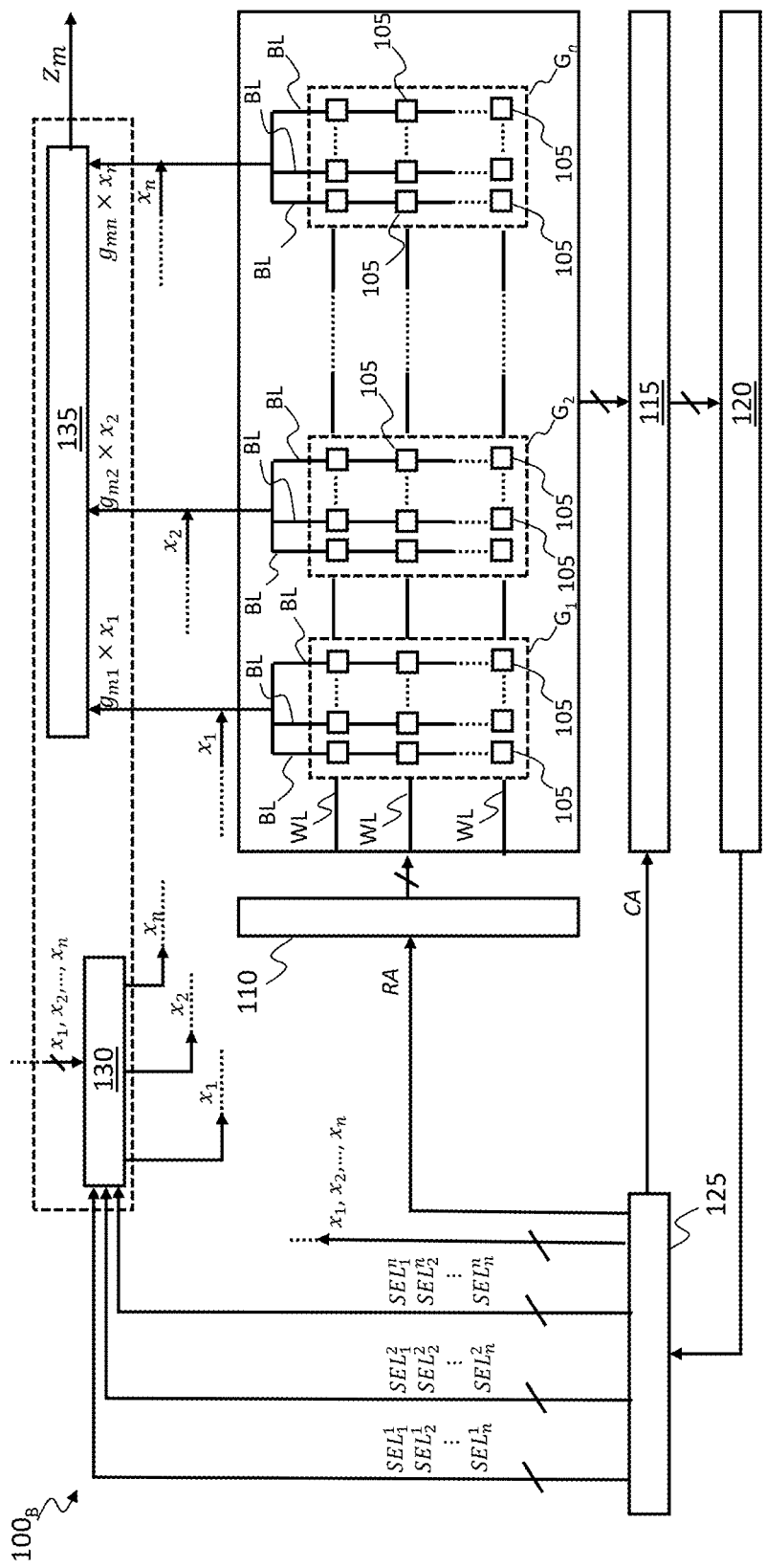
FIG. 1B shows a schematic circuit diagram of a memory device according to an embodiment.

With reference to the drawings, FIGS. 1A and 1B show schematic circuit diagrams of a known memory device $100_A$ and of a memory device $100_B$ according to an embodiment, respectively.

In the following, when one or more features of the memory devices are introduced by the wording "according to an embodiment," they are to be construed as features additional or alternative to any features previously introduced, unless otherwise indicated and/or unless evident incompatibility among feature combinations.

In the following, only elements of (and operations performed by) the memory devices deemed relevant for the understanding of the present disclosure will be shown and discussed, with other well-known elements of (and operations performed by) the memory devices that will be intentionally omitted for the sake of conciseness.

With particular reference to FIG. 1A, the memory device $100_A$ comprises a plurality of memory cells 105.

According to an embodiment, the memory cells 105 are programmable to store each one a logic state among a plurality of (i.e., two or more) logic states.

According to an embodiment, the memory cells 105 are programmable to store each one a logic state according to a respective programming electric current flowing therethrough.

According to an embodiment, the memory cells 105 comprise PCM ("Phase Change Memory") memory cells. Broadly speaking, a PCM memory cell is configured to store data using phase change materials (such as chalcogenide) capable of stably transitioning between amorphous and crystalline phases according to an amount of heat transferred thereto (wherein the amount of heat is determined by the programming electric current applied to the memory cell). The amorphous and crystalline phases exhibit different resistance values, (or, equivalently, transconductance values) which are used to distinguish different logic states of the memory cell: particularly, the amorphous phase exhibits a relatively high resistance (or, equivalently, a relatively low transconductance value), and the crystalline phase exhibits a relatively low resistance (or, equivalently, a relatively high transconductance value).

According to an embodiment, the amorphous phase is used to represent a logic state "o" (usually referred to as RESET state), and the crystalline phase is used to represent a logic state "1" (usually referred to as SET state).

Examples of memory cells other than the PCM memory cells that may be used in the memory device $100_A$ comprise, but are not limited to, ST-MRAM ("Spin Torque Magnetoresistive Random Access Memory Cells") memory cells and RRAM ("Resistive Random Access Memory Cells") memory cells.

According to an embodiment, the memory cells 105 are arranged in a matrix of rows, corresponding to a plurality of word lines WL, and columns, corresponding to a plurality of bit lines BL, the memory cells 105 being for example arranged in the matrix at intersections between the world lines WL and the bit lines BL.

According to an embodiment, each word line WL is associated with a respective row of memory cells of the plurality of memory cells.

According to an embodiment, each bit line BL is associated with a respective column of memory cells of the plurality of memory cells. According to an embodiment, each bit line BL is configured to be flown through by an electric current indicative of the logic state of (i.e., stored in) a selected memory cell of the respective column of memory cells (the value of the electric current depending on the resistance/transconductance value exhibited by the selected memory cell).

According to an embodiment, the memory device 100A comprises a row selection circuit 110 for selecting one or more word lines among the plurality of word lines WL according to a row address RA, and a column selection circuit 115 for selecting one or more bit lines among the plurality of bit lines BL according to a column address CA, each pair of selected word line and bit line identifying a corresponding selected memory cell of the plurality of memory cells 105.

According to an embodiment, the column selection circuit 115 comprises a hierarchical column selection circuit, i.e. a column selection circuit wherein column selection takes place according to different selection levels.

According to an embodiment, the memory device $100_A$ comprises a reading circuit 120 selectively coupleable to the bit lines BL (i.e., coupleable to selected bit lines of the plurality of bit lines BL) for reading the logic state of the selected memory cells.

According to an embodiment, selective coupling of the reading circuit 120 to the bit lines BL takes place based on the column address CA (with the column address CA that may for example enable a corresponding conductive path across the hierarchical column selection circuit).

According to an embodiment, the reading circuit 120 is decoupleable from the plurality of bit lines BL during one or more operations of the memory device $100_A$ other than reading operations. According to an embodiment, decoupling of the reading circuit 120 from the plurality bit lines BL takes place by proper disabling of one or more selection levels of the hierarchical column selection circuit.

According to an embodiment, the reading circuit 120 comprises a sensing circuit configured to sense the logic state of the selected memory cell according to the electric current flowing through the selected memory cell and a reference electric current (e.g., according to a comparison between the electric current flowing through the selected memory cell and the reference electric current).

According to an embodiment, the memory device $100_A$ comprises a control logic unit 125 configured to control an overall operation of the memory device $100_A$.

As conceptually represented in the figure by respective arrow connections, for the purposes of the present disclosure the control logic unit 125 is configured to provide the row RA and column CA addresses, to receive the logic state sensed by the sensing circuit, and to control a computing circuit (discussed here below).

Turning now to FIG. 1B, according to the principles of the present disclosure, the memory device $100_B$ further comprises (in addition to the elements of the memory device $100_A$) a computing circuit electrically coupleable to the bit lines BL for providing an output electric quantity (e.g., an output electric voltage) $z_m$ indicative of a linear combination of a plurality of input electric quantities (e.g., a plurality of input electric voltages) $x_1, x_2, \ldots, x_n$.

For the purposes of the present disclosure, a linear combination of terms is an expression constructed by multiplying each term by a respective coefficient (e.g., a constant) and adding the results. Similarly, the output electric voltage $z_m$ indicative of the linear combination of the input electric voltages $x_1, x_2, \ldots, x_n$ is an expression constructed by multiplying each input electric voltage $x_1, x_2, \ldots, x_n$ by a respective coefficient $g_{m1}, g_{m2}, \ldots g_{mn}$ and adding the results, i.e.:

$$\begin{bmatrix} z_1 \\ z_2 \\ \vdots \\ z_m \end{bmatrix} = \begin{bmatrix} g_{11} & g_{12} & \cdots & g_{1n} \\ g_{21} & g_{22} & \cdots & g_{2n} \\ \vdots & \vdots & & \vdots \\ g_{m1} & g_{m2} & \cdots & g_{mn} \end{bmatrix} \times \begin{bmatrix} x_1 \\ x_2 \\ \vdots \\ x_n \end{bmatrix}$$

$$\begin{cases} z_1 = g_{11} \times x_1 + g_{12} \times x_2 + \ldots + g_{1n} \times x_n \\ z_2 = g_{21} \times x_1 + g_{22} \times x_2 + \ldots + g_{2n} \times x_n \\ \quad \vdots \\ z_m = g_{m1} \times x_1 + g_{m2} \times x_2 + \ldots + g_{mn} \times x_n \end{cases}$$

According to an embodiment, the computing circuit implements an "Artificial Neural Network" (ANN network), or at least a part thereof. According to an embodiment, the computing circuit implements neural nodes of the ANN network. According to an embodiment, the computing circuit implements input layer neural nodes of the ANN network aimed at providing the plurality of input electric voltages (terms) and respective weights (coefficients), and functional portions of hidden layer neural nodes of the ANN network aimed at determining each one a respective linear combination of the plurality of input electric voltages.

According to an embodiment, functional portions of the hidden layer neural nodes of the ANN network aimed at processing the linear combinations of the input electric voltages based on a proper activation function are implemented at a proper entity or module of an electronic system including the memory device $100_B$ (as better discussed in the following).

According to an embodiment, the (analog) input electric voltages $x_1, x_2, \ldots, x_n$ are generated by a proper voltage generator circuit (not shown) of the memory device $100_B$.

According to an embodiment, not shown, the (analog) input electric voltages $x_1, x_2, \ldots, x_n$ are obtained from proper digital to analog conversion of corresponding digital input electric voltages. According to an embodiment, the digital input electric voltages are provided by the control logic unit 125.

According to an embodiment, the computing circuit comprises a biasing stage 130 configured to bias the bit lines BL with the input electric voltages $x_1, x_2, \ldots, x_n$, whereby the electric current flowing through each bit line BL (hereinafter, computation electric current) depends on a product between the input electric voltage $x_1, x_2, \ldots, x_n$ applied to that bit line BL and the transconductance value of the selected memory cell associated with that bit line BL (the transconductance values of the selected memory cells thus representing the coefficients $g_{m1}, g_{m2}, \ldots, g_{mn}$ applied to the input electric voltages $x_1, x_2, \ldots, x_n$, respectively), i.e. $g_{m1} \times x_1, g_{m2} \times x_2, \ldots g_{mn} \times x_n$.

According to an embodiment, the biasing stage 130 is configured to bias the bit lines BL associated with respective groups of memory cells (hereinafter, cell groups) $G_1, G_2, \ldots, G_n$. According to an embodiment, the biasing stage 130 is configured to bias the bit lines BL associated with each cell group $G_1, G_2, \ldots, G_n$ with a respective one of the input electric voltages $x_1, x_2, \ldots, x_n$. In the exemplary considered embodiment, the number of cell groups corresponds to the number n of input electric voltages $x_1, x_2, \ldots, x_n$, although this should not be construed limitatively.

In the exemplary considered embodiment, $g_{m1} \times x_1$ represents the computing electric current from the bit lines BL associated with the cell group $G_1$, $g_{m2} \times x_2$ represents the computing electric current from the bit lines BL associated with the cell group $G_2$, and $g_{mn} \times x_n$ represents the computing electric current from the bit lines BL associated with the cell group $G_n$.

According to an embodiment, not shown, the value of each coefficient $g_{m1}, g_{m2}, \ldots, g_{mn}$ to be applied to the respective input electric voltage $x_1, x_2, \ldots, x_n$ may result from the selection of two or more memory cells 105 of the respective cell group $G_1, G_2, \ldots, G_n$.

According to an embodiment, the number of memory cells to be selected may differ for each cell group $G_1, G_2, \ldots, G_n$. According to an embodiment, the number of memory cells 105 of each cell group $G_1, G_2, \ldots, G_n$ to be selected to obtain a desired value of the respective coefficient $g_{m1}, g_{m2}, \ldots, g_{mn}$ depends on the transconductance exhibited by the memory cells of that cell group $G_1, G_2, \ldots, G_n$ (which in turn depends on a current the logic state actually stored therein).

According to an embodiment, the value of each coefficient $g_{m1}, g_{m2}, \ldots, g_{mn}$ to be applied to the respective input electric voltage $x_1, x_2, \ldots, x_n$ may result from the selection of two or more memory cells 105 that, in the respective cell group $G_1, G_2, \ldots, G_n$, are arranged in a same column of memory cells (i.e., concurrent selection of two or more word lines WL may be provided for each cell group $G_1, G_2, \ldots, G_n$), so that the value of each coefficient $g_{m1}, g_{m2}, \ldots, g_{mn}$ represents an average value of the transconductance values of the selected memory cells in the same column (i.e., that are associated with a same bit line). Just as an example, denoting by $g_{a1}$ and $g_{b1}$ the transconductance values of two memory cells of the cell group $G_1$ that are associated with a same bit line, denoting by $g_{c2}$ and $g_{d2}$ the transconductance values of two memory cells of the cell group $G_2$ that are associated with a same bit line, and denoting by $g_{en}$ and $g_{fn}$ the transconductance values of two memory cells of the cell group $G_n$ that are associated with a same bit line, the computing electric currents from the bit lines BL associated with the cell groups $G_1, G_2$ and $G_n$ are, respectively, $$g_{m1} \times x_1 = (g_{a1} + g_{b1}) \times x_1$$

$$g_{m2} \times x_2 = (g_{c2} + g_{d2}) \times x_2$$

$$g_{mn} \times x_n = (g_{en} + g_{fn}) \times x_n$$

According to an embodiment, the computing circuit comprises a combining stage 135 for combining the computing electric currents from the bit lines BL associated with the cell groups $G_1, G_2, \ldots, G_n$ thereby obtaining the output electric voltage $z_m$.

According to an embodiment, the control logic unit 125 is configured to electrically decouple the reading circuit 120 from the plurality of bit lines BL when the computing circuit is electrically coupled to the plurality of bit lines BL, whereby the computing electric currents from the bit lines BL associated with the cell groups $G_1, G_2, \ldots, G_n$ are not affected by the reading circuit 120. As mentioned above, according to an embodiment, the control logic unit 125 is configured to electrically decouple the reading circuit 120 from the plurality of bit lines BL by disabling one or more selection levels of the hierarchical column selection circuit.

Figure 2:
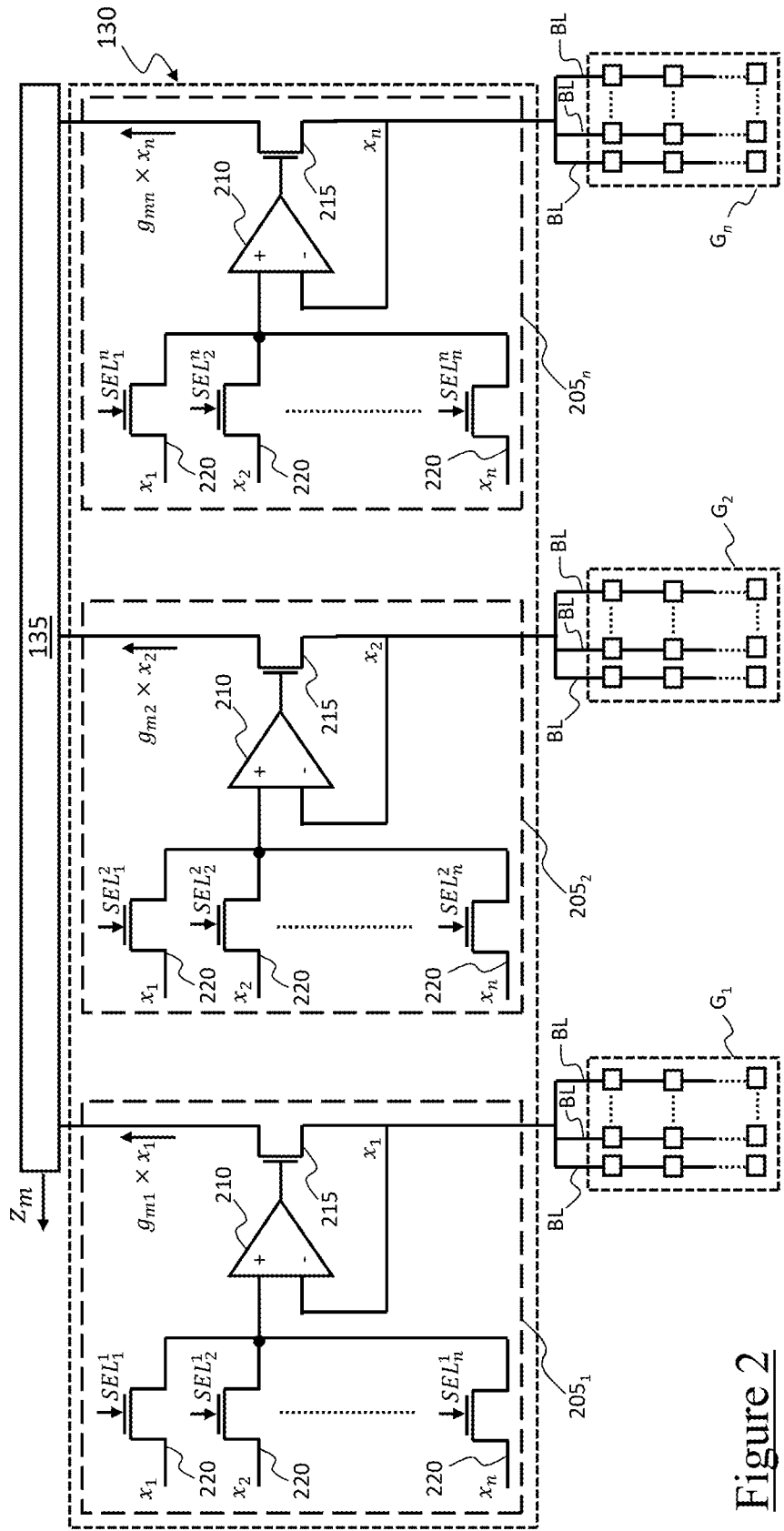
FIGS. 2 and 3A-3C show schematic circuit diagrams of a computing circuit of the memory device of FIG. 1B according to embodiments.

With reference now to FIG. 2, it shows a schematic circuit diagram of the computing circuit, and particularly of the biasing stage 130, according to an embodiment.

According to an embodiment, the biasing stage 130 comprise a plurality of biasing circuits $205_1, 205_2, \ldots, 205_n$ (only three shown in the figure) each one electrically coupled (e.g., directly connected) to the bit lines BL associated with a respective cell group $G_1, G_2, \ldots, G_n$ for biasing them with a respective one of the input electric voltages $x_1, x_2, \ldots, x_n$. In the exemplary considered embodiment, the biasing circuit $205_1$ is configured to bias the bit lines BL associated with the cell group $G_1$ with the input electric voltage $x_1$, the biasing circuit $205_2$ is configured to bias the bit lines BL associated with the cell group $G_2$ with the input electric voltage $x_2$, and the biasing circuit $205_n$ is configured to bias the bit lines BL associated with the cell group $G_n$ with the input electric voltage $x_n$.

According to an embodiment, each biasing circuit $205_1, 205_2, \ldots, 205_n$ comprises a voltage controlled current source being adapted to be controlled by a respective one of the of input electric voltages $x_1, x_2, \ldots, x_n$.

According to an embodiment, the voltage controlled current source of each biasing circuit $205_1, 205_2, \ldots, 205_n$ comprises a respective operational amplifier 210 having a non-inverting input terminal (denoted by "+" in the figure)

for receiving a selected one among the input electric voltages $x_1, x_2, \ldots, x_n$, an inverting input terminal (denoted by "−" in the figure), and an output terminal electrically coupled to the inverting input terminal in negative feedback configuration. As better discussed in the following, the operational amplifier 210 may be also omitted in basic embodiments of the voltage controlled current source.

According to an embodiment, the voltage controlled current source of each biasing circuit $205_1, 205_2, \ldots, 205_n$ comprises a respective regulator transistor 215. According to an embodiment, the regulator transistor 215 comprises an N-MOS transistor having a gate terminal electrically coupled (e.g., directly connected) to the output terminal of the operational amplifier 210, a drain terminal electrically coupled (e.g., directly connected) to the combining stage 135, and a source terminal electrically coupled (e.g., directly connected) to the bit lines BL associated with the respective cell group $G_1, G_2, \ldots, G_n$.

According to well-known principles of negative feedback configuration, the voltage controlled current source of each biasing circuit $205_1, 205_2, \ldots, 205_n$ operates as follows. The high open loop gain of the operational amplifier 210 forces the gate terminal of the regulator transistor 215 to such an electric voltage that the respective input electric voltage $x_1, x_2, \ldots, x_n$ appears at the source terminal of the regulator transistor 215, and hence across the selected memory cell of the respective cell group $G_1, G_2, \ldots, G_n$. The selected memory cell of each cell group $G_1, G_2, \ldots, G_n$ is thus flown through by a corresponding computing electric current equal to the product between the respective input electric voltage $x_1, x_2, \ldots, x_n$ and the transconductance value $g_{m1}, g_{m2}, \ldots, g_{mn}$ of the respective selected memory cell, i.e. currents $g_{m1} \times x_1, g_{m2} \times x_2, \ldots g_{mn} \times x_n$. Each computing electric current currents $g_{m1} \times x_1, g_{m2} \times x_2, \ldots g_{mn} \times x_n$ also flows at the drain terminal of the respective regulator transistor 215, and is provided to the combining stage 135.

According to an embodiment, each biasing circuit $205_1, 205_2, \ldots, 205_n$ comprises a selection circuit configured to provide a selected one of the plurality of input electric voltages $x_1, x_2, \ldots, x_n$ to the voltage controlled current source (i.e., to the non-inverting input terminal of the respective operational amplifier 210). As better discussed in the following, the selection circuit may be also omitted in basic embodiments of the biasing circuit.

According to an embodiment, each selection circuit comprises a plurality of selection transistors 220, for example a plurality of NMOS transistors. According to an embodiment, each selection transistor 220 of each selection circuit is arranged in pass-transistor configuration, i.e. it comprises a drain terminal for receiving a respective one of the input electric voltages $x_1, x_2, \ldots, x_n$, a gate terminal for receiving a respective selection signal, and a source terminal electrically coupled (e.g., directly connected) to the non-inverting input terminal of the respective operational amplifier 210.

In the following, the selection signals controlling the selection transistors 220 that, in the biasing circuits $205_1, 205_2, \ldots, 205_n$, receive the input electric voltage $x_1$ will be respectively denoted by selection signals $SEL_1^1, SEL_1^2, SEL_1^n$, the selection signals controlling the selection transistors 220 that, in the biasing circuits $205_1, 205_2, \ldots, 205_n$, receive the input electric voltage $x_2$ will be respectively denoted by selection signals $SEL_2^1, SEL_2^2, SEL_2^n$, and the selection signals controlling the selection transistors 220 that, in the biasing circuits $205_1, 205_2, \ldots, 205_n$, receive the input electric voltage $x_n$ will be respectively denoted by selection signals $SEL_n^1, SEL_n^2, SEL_n^n$.

According to an embodiment, each selection transistor 220 of each biasing circuit $205_1, 205_2, \ldots, 205_n$ is configured to allow or prevent passage of the respective input electric voltage $x_1, x_2, \ldots, x_n$ (from the drain terminal of the selection transistor 220 to the source terminal of the selection transistor 220, and hence to the voltage controlled current source electrically coupled thereto) according to a value of the respective selection signal.

According to an embodiment, each selection signal is a digital signal taking a first (e.g., high) logic level that allows passage of the respective input electric voltage to the voltage controlled current source, or a second (e.g., low) logic level that prevents passage of the respective input electric voltage to the voltage controlled current source.

According to an embodiment, when the reading circuit 120 is electrically coupled to selected bit lines (e.g., for reading the logic state of corresponding memory cells), all the selection signals are at the low logic level, so as to disable the computing circuit during reading operations of the memory device $100_B$.

According to an embodiment, each selection signal (or at least a subset thereof) is provided by the control logic unit 125 (as illustrated in FIG. 1B).

As mentioned above, the operational amplifier 210 may be omitted in basic embodiments of the voltage controlled current source (not shown): in these embodiments, the gate terminal of the regulator transistor 215 of each biasing circuit $205_1, 205_2, \ldots, 205_n$, may be electrically coupled (e.g., directly connected) to the source terminals of the selection transistors 220 associated with that biasing circuit $205_1, 205_2, \ldots, 205_n$ (i.e., without interposition of the operational amplifier 210, and hence without connections between the gate and source terminals of the regulator transistor 215).

As mentioned above, the selection circuit may be omitted in basic embodiments of the biasing circuit (not shown): in these embodiments, the gate terminal of the regulator transistor 215 of each biasing circuit $205_1, 205_2, \ldots, 205_n$ may directly receive the respective input electric voltage $x_1, x_2, \ldots, x_n$ (i.e., without interposition of the selection circuit, the respective input electric voltage being for example provided by the control logic unit 125).

Figure 3A:
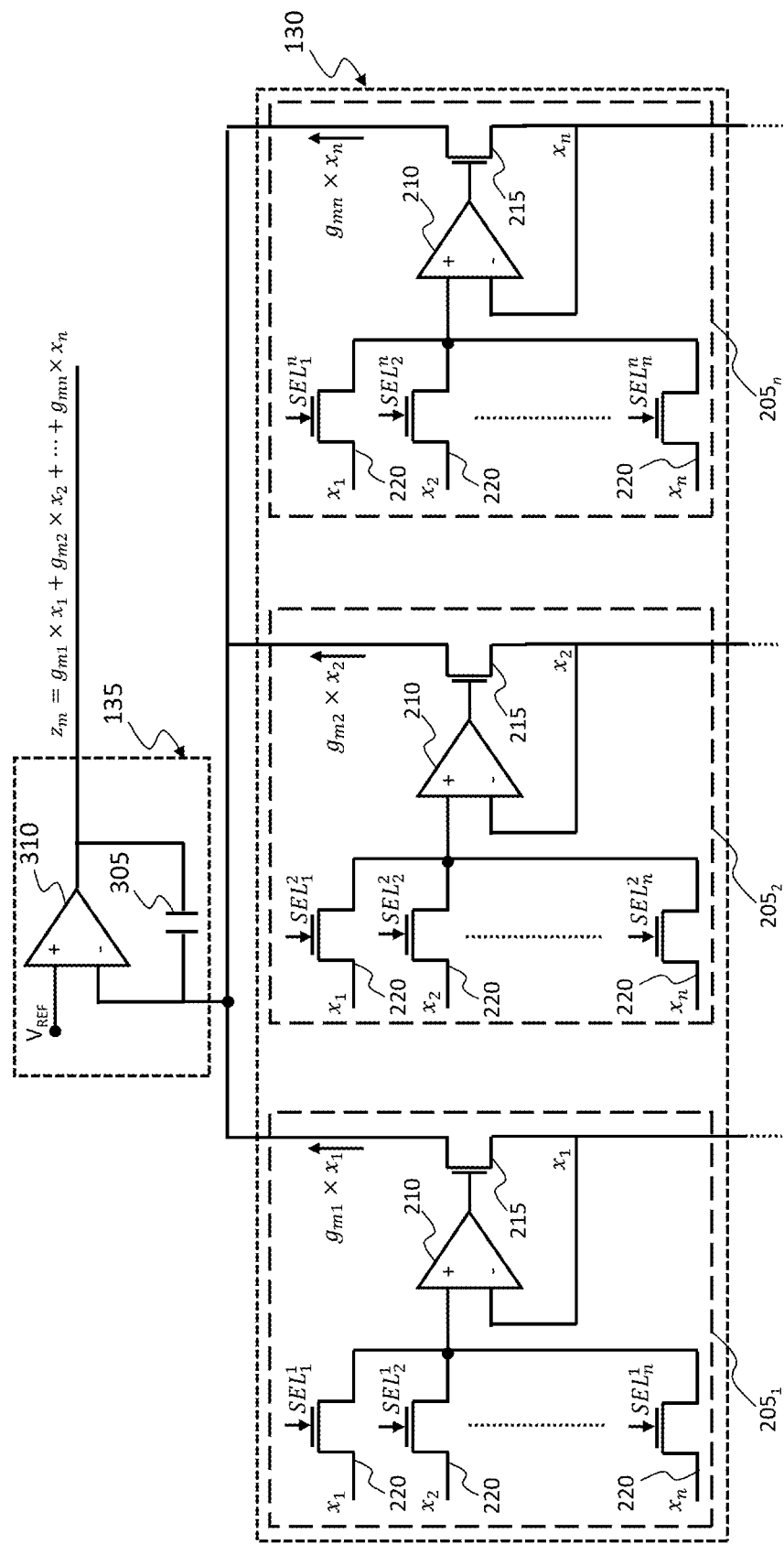
Figure 3B:
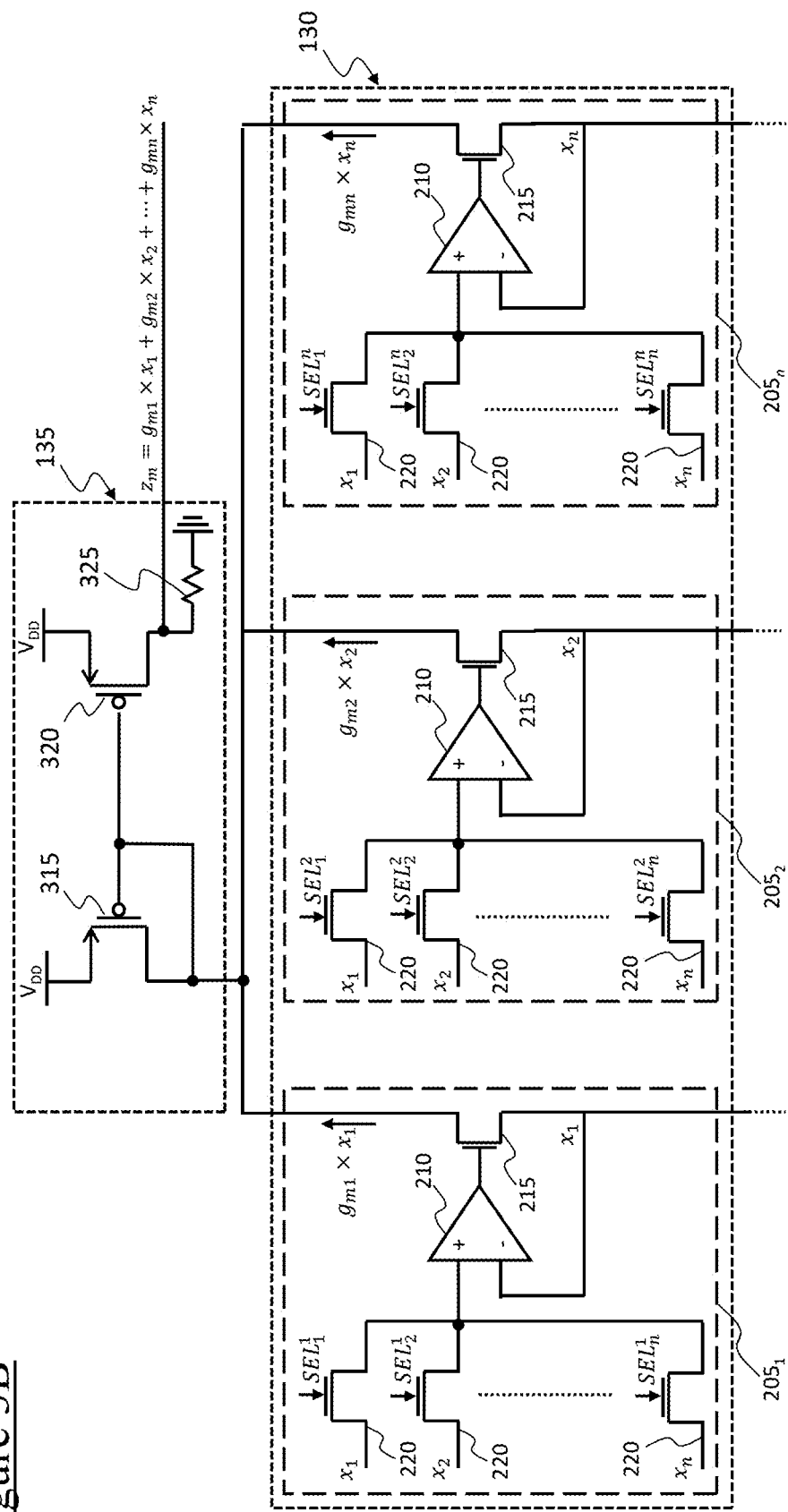
Figure 3C:
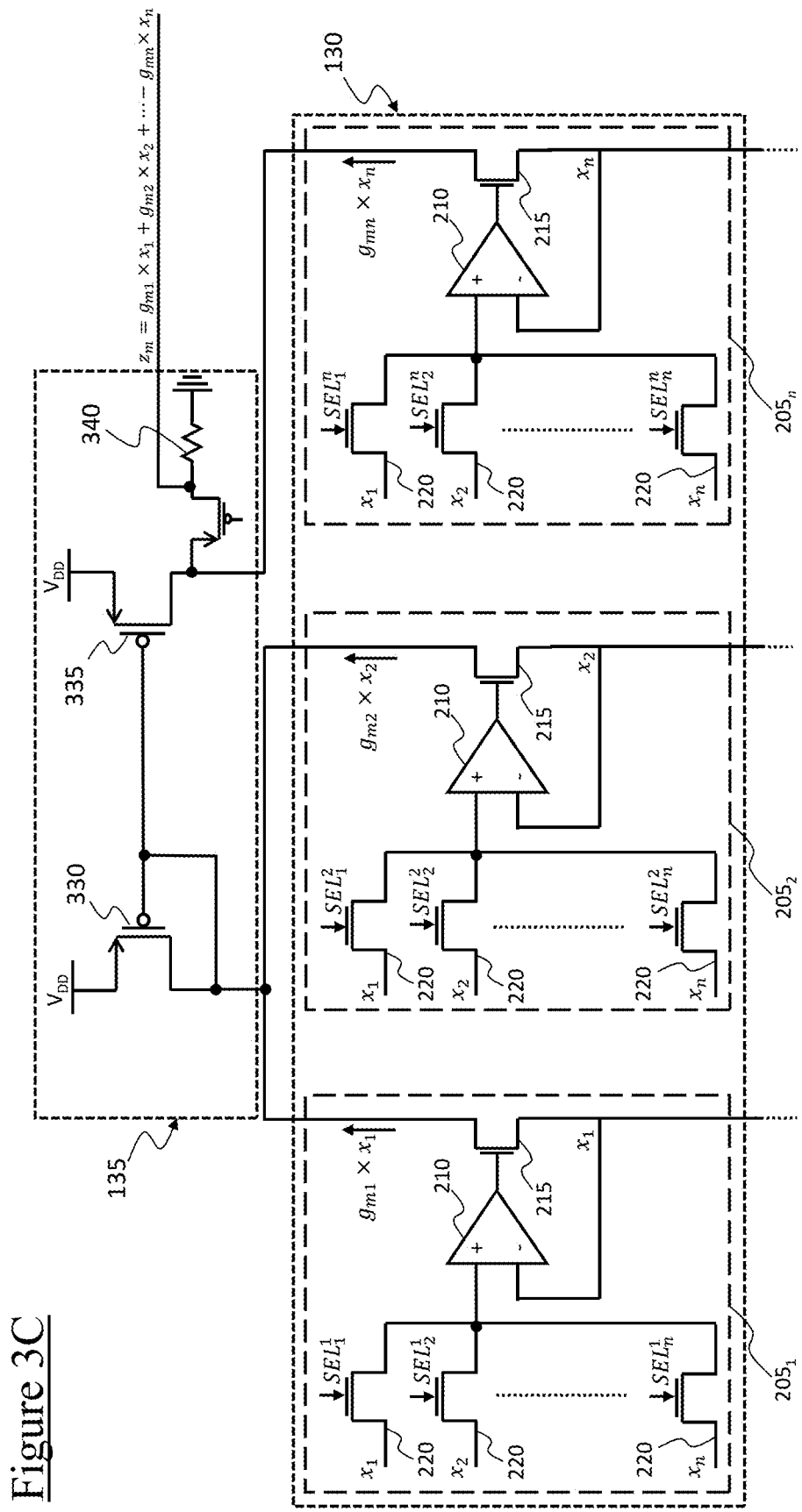

With reference now to FIGS. 3A-3C, they show schematic circuit diagrams of the computing circuit, and particularly of the combining stage 135, according to embodiments.

According to an embodiment, illustrated in FIG. 3A, the combining stage 135 comprises an integrator circuit.

According to an embodiment, the integrator circuit comprises an operational amplifier—based integrator circuit.

According to an embodiment, the integrator circuit comprises a capacitive element (e.g., a capacitor) 305 having a first terminal electrically coupled (e.g., directly connected) to the drain terminals of the regulator transistors 215 of the biasing circuits $205_1, 205_2, \ldots, 205_n$ for receiving the computing electric currents $g_{m1} \times x_1, g_{m2} \times x_2, \ldots g_{mn} \times x_n$ therefrom, and a second terminal, and an operational amplifier 310 having a non-inverting input terminal (denoted by "+" in the figure) for receiving a reference voltage $V_{REF}$, an inverting input terminal (denoted by "−" in the figure) electrically coupled (e.g., directly connected) to the first terminal of the capacitor 305, and an output terminal electrically coupled to the second terminal of the capacitor 305 (the output terminal of the operational amplifier 310 providing the output electric voltage $z_m$ as the sum of the computing electric currents $g_{m1} \times x_1, g_{m2} \times x_2, \ldots g_{mn} \times x_n$).

According to embodiments, illustrated in FIGS. 3B and 3C, the combining stage 135 comprises a current mirror circuit.

According to FIG. 3B embodiment, the current mirror circuit comprises a first circuit branch electrically couplable to the bit lines BL for receiving the computing electric currents $g_{m1} \times x_1$, $g_{m2} \times x_2$, ... $x_{mn} \times x_n$ therefrom, a second circuit branch in mirror configuration with the first circuit branch, whereby the computing electric currents $g_{m1} \times x_1$, $g_{m2} \times x_2$, ... $x_{mn} \times x_n$ from the bit lines BL of the biasing circuits $205_1$, $205_2$, ..., $205_n$ are mirrored from the first circuit branch to the second circuit branch, and an impedance load for receiving the mirrored computing electric currents $g_{m1} \times x_1$, $g_{m2} \times x_2$, ... $g_{mn} \times x_n$ and providing the output electric voltage $z_m$.

According to an embodiment, the first circuit branch of the current mirror comprises a first transistor 315 (e.g., a PMOS transistor) in diode-connected configuration, i.e. having a source terminal receiving a supply voltage $V_{DD}$, a drain terminal electrically coupled (e.g., directly connected) to the drain terminals of the regulation transistors 215 of the biasing circuits $205_1$, $205_2$, ..., $205_n$, and a gate terminal electrically connected to the drain terminal.

According to an embodiment, the second circuit branch of the current mirror comprises a second transistor 320 (e.g., a PMOS transistor) having a source terminal receiving the supply voltage $V_{DD}$, a gate terminal electrically coupled (e.g., directly connected) to the gate terminal of the first transistor 315, and a drain terminal providing a copy of the computing electric currents $g_{m1} \times x_1$, $g_{m2} \times x_2$, ... $g_{mn} \times x_n$ (or a scaled version thereof, in alternative embodiments).

According to an embodiment, the impedance load of the current mirror comprises a resistive load (e.g., a load resistor) 325 having a first terminal electrically coupled (e.g., directly connected) to the drain terminal of the second transistor 320, and a second terminal receiving a ground voltage (e.g., 0V), the output electric voltage $z_m$ resulting across the load resistor 325 (particularly, at the first terminal thereof) according to the computing electric currents $g_{m1} \times x_1$, $g_{m2} \times x_2$, ... $g_{mn} \times x_n$ and a resistance value of the load resistor 325.

According to FIG. 3C embodiment, the current mirror circuit comprises a first circuit branch electrically couplable to a first subset of the bit lines BL (e.g., to the bit lines BL of a first subset of the biasing circuits $205_1$, $205_2$, ..., $205_n$) for receiving the respective computing electric currents therefrom, a second circuit branch in mirror configuration with the first circuit branch and electrically couplable to a second subset of the bit lines BL (e.g., to the bit lines BL of a second subset of the biasing circuits $205_1$, $205_2$, ..., $205_n$), and an impedance load for receiving the mirrored electric currents from the first subset of bit lines BL and the electric currents from the second subset of bit lines BL, and for providing the output electric voltage (or other output electrical quantity) therefrom.

In the exemplary considered embodiment, the first circuit branch of the current mirror comprises a first transistor 330 (e.g., a PMOS transistor) in diode-connected configuration, i.e. having a source terminal receiving the supply voltage $V_{DD}$, a drain terminal electrically coupled (e.g., directly connected) to the drain terminals of the regulation transistors 215 of the first subset of biasing circuits $205_1$, $205_2$, ..., $205_n$, and a gate terminal electrically connected to the drain terminal. According to an embodiment, as illustrated, the first subset of the biasing circuits $205_1$, $205_2$, ..., $205_n$ comprises the biasing circuits $205_1$, $205_2$, whereby the corresponding computing electric currents $g_{m1} \times x_1$, $g_{m2} \times x_2$ are received at the drain terminal of the first transistor 330.

According to an embodiment, the second circuit branch of the current mirror comprises a second transistor 335 (e.g., a PMOS transistor) having a source terminal receiving the supply voltage $V_{DD}$, a gate terminal electrically coupled (e.g., directly connected) to the gate terminal of the first transistor 330, and a drain terminal providing a copy of the computing electric currents $g_{m1} \times x_1$, $g_{m2} \times x_2$ (or a scaled version thereof, in alternative embodiments). According to an embodiment, the drain terminal of the second transistor 335 is electrically coupled (e.g., directly connected) to the drain terminals of the regulation transistors 215 of the second subset of biasing circuits $205_1$, $205_2$, ..., $205_n$. According to an embodiment, as illustrated, the second subset of the biasing circuits $205_1$, $205_2$, ..., $205_n$ comprises the biasing circuit $205_n$, whereby the corresponding computing electric current $g_{mn} \times x_n$ is received at the drain terminal of the second transistor 335.

According to an embodiment, the impedance load of the current mirror comprises a resistive load (e.g., a load resistor) 340 having a first terminal electrically coupled to the drain terminal of the second transistor 335 and a second terminal receiving the ground voltage (e.g., 0V). Since the computing electric currents $g_{m1} \times x_1$, $g_{m2} \times x_2$ and the computing electric current $g_{mn} \times x_n$ at the drain terminal of the second transistor 335 have opposite directions, a difference computing electric current equal to a difference between the computing electric currents $g_{m1} \times x_1$, $g_{m2} \times x_2$ and the computing electric current $g_{mn} \times x_n$ results across the load resistor 340 and a corresponding output electric voltage $z_m$ depending on the difference computing electric current and a resistance value of the load resistor 340 results across the resistor 340 (particularly, at the first terminal thereof): thus, the current mirror circuit according to FIG. 3C embodiment allows obtaining a linear combination with one or more negative coefficients.

According to an embodiment, the first terminal of the load resistor 340 is electrically coupled to the drain terminal of the second transistor 335 by interposition of a coupling circuit. According to an embodiment, the coupling circuit comprises a coupling transistor 345, for example a PMOS transistor. According to an embodiment, the coupling transistor 345 is arranged in pass-transistor configuration, i.e. it comprises a source terminal electrically coupled to the drain terminal of the second transistor 335, a gate terminal for receiving a command signal (not shown), and a drain terminal electrically coupled (e.g., directly connected) to the first terminal of the load resistor 340.

According to an embodiment, the command signal is a digital signal taking a first (e.g., high) logic level that allows passage of the difference computing electric to the load resistor 340, or a second (e.g., low) logic level that prevents passage of the difference computing electric to the load resistor 340.

According to an embodiment, not shown, the command signal is provided by the control logic unit 125.

Thanks to the computing circuit, a memory device implementing an advanced in-memory computing is obtained. Indeed, contrary to the conventional solutions of in-memory computing, in which big data processing (such as matrix processing) is serially performed by microcontroller units, the computing circuit of the present disclosure allows performing parallel big data processing by exploiting the memory cells (and the logic states stored therein) and the bit lines already available in the memory device. This allows a significant reduction in energy consumption and processing times, especially in case of big data processing (such as matrix processing for neural network applications), and avoids the use of additional non-volatile memory to store processing parameters (e.g., neural network parameters, such as the coefficients of the linear combinations).

Moreover, the computing circuit according to the disclosed embodiments has a low circuit complexity and mainly requires simple electrical connections to the bit lines already available at a top of any existing memory device: this allows the computing circuit to be easily designed and added to any existing memory cut.

Figure 4:
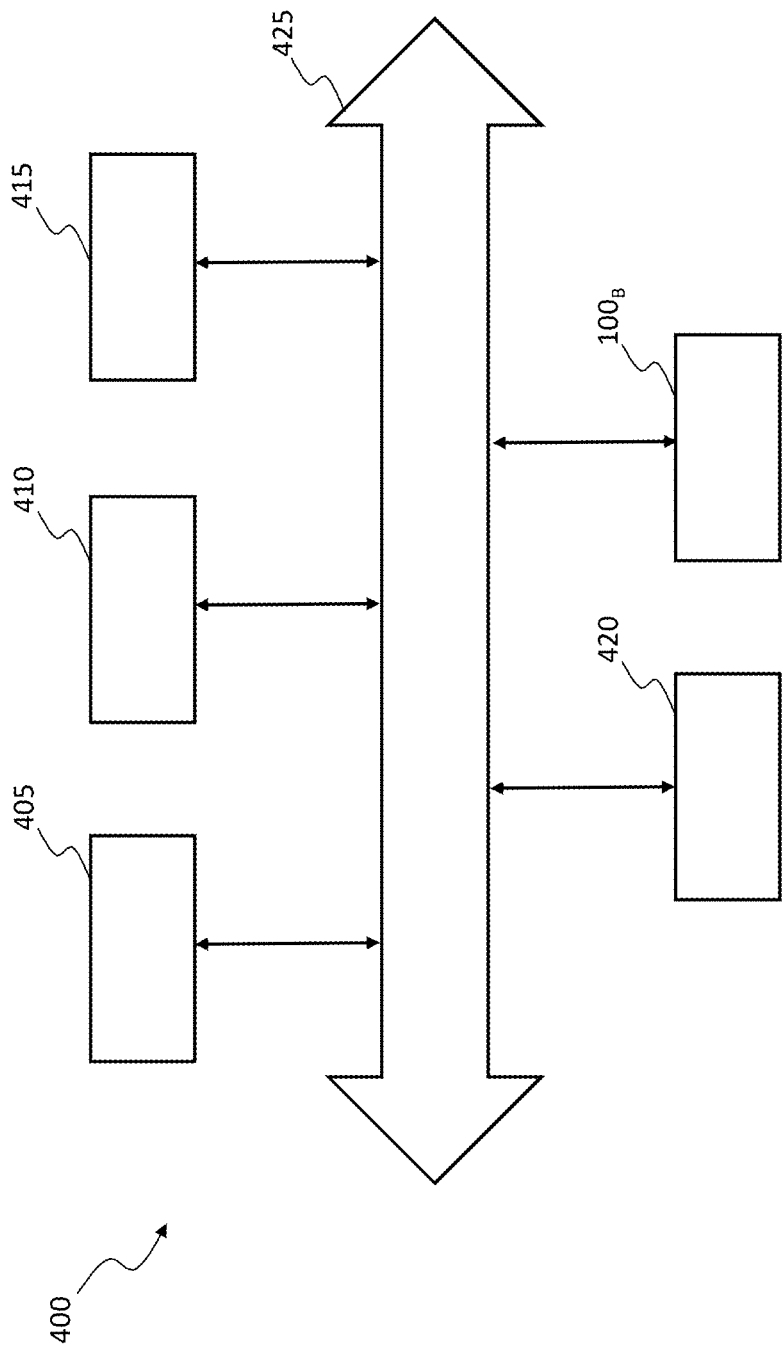
FIG. 4 shows a simplified block diagram of an electronic system comprising the memory device of FIG. 1B according to an embodiment.

Referring now to FIG. 4, it shows a simplified block diagram of an electronic system 400 (i.e., a portion thereof) comprising the memory device 100B (or more thereof) according to an embodiment.

According to an embodiment, the electronic system 400 is suitable for use in electronic devices such as handheld computers (PDAs, "Personal Digital Assistants"), laptop or portable computers, and mobile phones (for example, smartphones).

According to an embodiment, the electronic system 400 comprises a controller 405 (for example, one or more microprocessors and/or one or more microcontrollers). According to an embodiment, the controller 405 is configured to implement functional portions of the hidden layer neural nodes of the ANN network aimed at processing the output electric voltage $z_m$ based on a proper activation function. According to an embodiment, the controller 405 is configured to implement further functional portions of the ANN network: just as an example, the controller 405 may be configured to continuously update the neural network parameters, such as the model weights (i.e., the coefficients of the linear combinations) according to a given optimization strategy, and to feed the updated parameters to the memory device $100_B$ for subsequent processing (by the computing circuit).

According to an embodiment, the electronic system 400 comprises an input/output device 410 (for example, a keyboard and/or a screen). The input/output device 410 may for example be used to generate and/or receive messages. The input/output device 410 may for example be configured to receive/supply a digital signal and/or an analog signal.

According to an embodiment, the electronic system 400 comprises a wireless interface 415 for exchanging messages with a wireless communication network (not shown), for example by means of radio frequency signals. Examples of a wireless interface may include antennas and wireless transceivers.

According to an embodiment, the electronic system 400 comprises a power supply device (for example, a battery 420) for powering the electronic system 400.

According to an embodiment, the electronic system 400 comprises one more communication channels (bus) 425 to allow the exchange of data between the memory device 100B, the controller 405 (when provided), the input/output device 410 (when provided), the wireless interface 415 (when provided), and the power supply device 420 (when provided).

Naturally, in order to satisfy local and specific requirements, a person skilled in the art may apply to the disclosure described above many logical and/or physical modifications and alterations. More specifically, although the present disclosure has been described with a certain degree of particularity with reference to preferred embodiments thereof, it should be understood that various omissions, substitutions and changes in the form and details as well as other embodiments are possible. In particular, different embodiments may even be practiced without the specific details set forth in the preceding description for providing a more thorough understanding thereof; on the contrary, well-known features may have been omitted or simplified in order not to encumber the description with unnecessary details. Moreover, it is expressly intended that specific elements and/or method steps described in connection with any disclosed embodiment may be incorporated in any other embodiment.

In particular, similar considerations apply if the memory device has a different structure or comprises equivalent components. In any case, any component thereof may be separated into several elements, or two or more components may be combined into a single element; furthermore, each component can be replicated to support the execution of the corresponding operations in parallel. It should also be noted that (unless otherwise indicated) any interaction between different components generally does not need to be continuous, and may be either direct or indirect through one or more intermediaries.

Moreover, although in the foregoing explicit reference has been exemplarily made to a memory device $100_B$ comprising a single computing circuit, embodiments may provide two or more computing circuits, e.g. in order to implement a multi-level ANN network. In these embodiments, each computing circuit may be electrically couplable to a respective subgroup of the cell groups $G_1, G_2, \ldots, G_n$ (or cell subgroup), with each cell subgroup that implements a respective computation level, and with the output electric quantity $z_m$ provided by each cell subgroup that may be fed to the cell subgroup implementing the respective next computation level.

What is claimed is:

1. A memory device comprising:
a plurality of memory cells, each memory cell configured to store at least one bit, each memory cell exhibiting a transconductance depending on a value of the at least one bit stored in the memory cell;
a plurality of bit lines associated with respective groups of memory cells of the plurality of memory cells, each bit line configured to flow a respective electric current indicative of the at least one bit stored in a selected memory cell of the respective group of memory cells; and
a computing circuit electrically couplable to the plurality of bit lines and configured to provide an output electric quantity indicative of a linear combination of a plurality of input electric quantities, the computing circuit comprising:
a biasing stage configured to bias each bit line with a respective one of the plurality of input electric quantities, whereby the electric current flowing through each bit line depends on a product of the respective input electric quantity and the transconductance of the selected memory cell of the respective group of memory cells, the input electric quantity and the transconductance associated with each electric current representing a respective term and a corresponding coefficient respectively, of the linear combination; and
a combining stage configured to combine the electric currents flowing through the plurality of bit lines, thereby obtaining the output electric quantity.

2. The memory device according to claim 1, further comprising:

a reading circuit electrically couplable to the plurality of bit lines for reading the at least one bit stored in the selected memory cell; and a coupling circuit for coupling the reading circuit to the plurality of bit lines, the coupling circuit being configured to electrically decouple the reading circuit from the plurality of bit lines when the computing circuit is electrically coupled to the plurality of bit lines.

3. The memory device according to claim 1, wherein the combining stage comprises an integrator circuit.

4. The memory device according to claim 3, wherein the integrator circuit is an operational amplifier-based integrator circuit.

5. The memory device according to claim 1, wherein the combining stage comprises a current mirror circuit, the current mirror circuit comprising:
a first circuit branch electrically couplable to the plurality of bit lines for receiving the electric currents therefrom;
a second circuit branch in mirror configuration with the first circuit branch, the electric currents from the plurality of bit lines being mirrored from the first circuit branch to the second circuit branch; and
an impedance load for receiving the mirrored electric currents and providing the output electric quantity therefrom.

6. The memory device according to claim 1, wherein the combining stage comprises a current mirror circuit, the current mirror circuit comprising:
a first circuit branch electrically couplable to a first subset of the plurality of bit lines for receiving the respective electric currents therefrom;
a second circuit branch in mirror configuration with the first circuit branch and electrically couplable to a second subset of the plurality of bit lines for receiving the respective electric currents therefrom, the electric currents from the first subset of the plurality of bit lines being mirrored from the first circuit branch to the second circuit branch; and
an impedance load for receiving the mirrored electric currents from the first subset of the plurality of bit lines and the electric currents from the second subset of the plurality of bit lines, and for providing the output electric quantity therefrom.

7. The memory device according to claim 1, wherein the plurality of input electric quantities comprises a plurality of input electric voltages, and wherein the biasing stage comprises a plurality of biasing circuits, each biasing circuit associated with a respective group of memory cells for biasing the biasing circuit with a respective one of the plurality of input electric voltages, and each biasing circuit comprising a voltage controlled current source being configured to be controlled by a respective one of the plurality of input electric voltages.

8. The memory device according to claim 1, wherein the biasing stage comprises a plurality of selection circuits, each selection circuit associated with a respective group of memory cells, and each selection circuit configured to provide a selected one of the plurality of input electric quantities to bias the bit lines associated with the respective group of memory cells.

9. The memory device according to claim 1, wherein the memory device comprises a phase-change memory device.

10. An electronic system comprising:
a communication channel;
a controller coupled to the communication channel; and
at least one memory device coupled to the communication channel, each memory device comprising:
a plurality of memory cells, each memory cell configured to store at least one bit, each memory cell exhibiting a transconductance depending on a value of the at least one bit stored in the memory cell;
a plurality of bit lines associated with respective groups of memory cells of the plurality of memory cells, each bit line configured to flow a respective electric current indicative of the at least one bit stored in a selected memory cell of the respective group of memory cells; and
a computing circuit electrically couplable to the plurality of bit lines and configured to provide an output electric quantity indicative of a linear combination of a plurality of input electric quantities, the computing circuit comprising:
a biasing stage configured to bias each bit line with a respective one of the plurality of input electric quantities, whereby the electric current flowing through each bit line depends on a product of the respective input electric quantity and the transconductance of the selected memory cell of the respective group of memory cells, the input electric quantity and the transconductance associated with each electric current representing a respective term and a corresponding coefficient respectively, of the linear combination; and
a combining stage configured to combine the electric currents flowing through the plurality of bit lines, thereby obtaining the output electric quantity.

11. The electronic system according to claim 10, wherein the memory device further comprises:
a reading circuit electrically couplable to the plurality of bit lines for reading the at least one bit stored in the selected memory cell; and
a coupling circuit for coupling the reading circuit to the plurality of bit lines, the coupling circuit being configured to electrically decouple the reading circuit from the plurality of bit lines when the computing circuit is electrically coupled to the plurality of bit lines.

12. The electronic system according to claim 10, wherein the combining stage comprises a current mirror circuit, the current mirror circuit comprising:
a first circuit branch electrically couplable to the plurality of bit lines for receiving the electric currents therefrom;
a second circuit branch in mirror configuration with the first circuit branch, the electric currents from the plurality of bit lines being mirrored from the first circuit branch to the second circuit branch; and
an impedance load for receiving the mirrored electric currents and providing the output electric quantity therefrom.

13. The electronic system according to claim 10, wherein the combining stage comprises a current mirror circuit, the current mirror circuit comprising:
a first circuit branch electrically couplable to a first subset of the plurality of bit lines for receiving the respective electric currents therefrom;
a second circuit branch in mirror configuration with the first circuit branch and electrically couplable to a second subset of the plurality of bit lines for receiving the respective electric currents therefrom, the electric currents from the first subset of the plurality of bit lines being mirrored from the first circuit branch to the second circuit branch; and
an impedance load for receiving the mirrored electric currents from the first subset of the plurality of bit lines and the electric currents from the second subset of the plurality of bit lines, and for providing the output electric quantity therefrom.

14. The electronic system according to claim 10, wherein the plurality of input electric quantities comprises a plurality of input electric voltages, and wherein the biasing stage comprises a plurality of biasing circuits, each biasing circuit associated with a respective group of memory cells for biasing the biasing circuit with a respective one of the plurality of input electric voltages, and each biasing circuit comprising a voltage controlled current source being configured to be controlled by a respective one of the plurality of input electric voltages.

15. A method of operating a memory device, the memory device comprising a plurality of memory cells, each memory cell configured to store at least one bit, each memory cell exhibiting a transconductance depending on a value of the at least one bit stored in the memory cell, a plurality of bit lines associated with respective groups of memory cells of the plurality of memory cells, each bit line configured to flow a respective electric current indicative of the at least one bit stored in a selected memory cell of the respective group of memory cells, and a computing circuit, the method comprising:

biasing, by a biasing stage in the computing circuit, each bit line with a respective one of a plurality of input electric quantities, whereby the electric current flowing through each bit line depends on a product of the respective input electric quantity and the transconductance of the selected memory cell of the respective group of memory cells; and combining, by a combining stage in the computing circuit, the electric currents flowing through the plurality of bit lines, thereby obtaining an output electric quantity indicative of a linear combination of the plurality of input electric quantities, the input electric quantity and the transconductance associated with each electric current representing a respective term and a corresponding coefficient respectively, of the linear combination.

16. The method according to claim 15, further comprising:

reading, by a reading circuit electrically couplable to the plurality of bit lines, the at least one bit stored in the selected memory cell; and electrically decoupling, by a coupling circuit, the reading circuit from the plurality of bit lines when the computing circuit is electrically coupled to the plurality of bit lines.

17. The method according to claim 15, further comprising:

receiving, by a first circuit branch of a current mirror circuit in the combining stage, the electrical currents from the plurality of bit lines;

mirroring, by a second circuit branch of the current mirror circuit, the electric currents from the plurality of bit lines in the first circuit branch; and providing, by an impedance load, the output electric quantity from the mirrored electric currents.

18. The method according to claim 15, further comprising:

receiving, by a first circuit branch of a current mirror circuit in the combining stage, the respective electrical currents from a first subset of the plurality of bit lines;

receiving, by a second circuit branch of the current mirror circuit, the respective electrical currents from a second subset of the plurality of bit lines;

mirroring, by the second circuit branch, the electric currents from the first subset of the plurality of bit lines; and providing, by an impedance load, the output electric quantity from the mirrored electric currents from the first subset of the plurality of bit lines and the electric currents from the second subset of the plurality of bit lines.

19. The method according to claim 15, wherein the plurality of input electric quantities comprises a plurality of input electric voltages, and the method further comprises:

biasing, by a respective group of memory cells, each biasing circuit of a plurality of biasing circuits in the biasing stage with a respective one of the plurality of input electric voltages; and controlling, by a respective one of the plurality of input electric voltages, a voltage controlled current source in each biasing circuit.

20. The method according to claim 15, wherein the biasing stage comprises a plurality of selection circuits, each selection circuit associated with a respective group of memory cells, and the method further comprises providing, by each selection circuit, a selected one of the plurality of input electric quantities to bias the bit lines associated with the respective group of memory cells.

* * * * *